(12) United States Patent
Kuriyama et al.

(10) Patent No.: US 6,657,885 B2
(45) Date of Patent: Dec. 2, 2003

(54) STATIC SEMICONDUCTOR MEMORY DEVICE

(75) Inventors: Hirotada Kuriyama, Hyogo (JP); Shigenobu Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/056,069

(22) Filed: Jan. 28, 2002

(65) Prior Publication Data

US 2002/0067636 A1 Jun. 6, 2002

Related U.S. Application Data

(62) Division of application No. 09/166,906, filed on Oct. 6, 1998, now Pat. No. 6,359,804.

(30) Foreign Application Priority Data

Apr. 16, 1998 (JP) .......................................... 10-106385

(51) Int. Cl.⁷ .............................................. G11C 11/00
(52) U.S. Cl. ........................ 365/154; 365/156; 257/368; 257/903
(58) Field of Search ................................. 365/154, 156; 257/368, 903, 904

(56) References Cited

U.S. PATENT DOCUMENTS

| 4,657,628 A | 4/1987 | Holloway et al. .......... 438/647 |
| 5,521,860 A | 5/1996 | Ohkubo ...................... 365/154 |
| 5,677,866 A | 10/1997 | Kinoshita |
| 5,880,503 A | 3/1999 | Matsumoto et al. |
| 5,955,768 A | 9/1999 | Liaw et al. |
| 5,965,922 A | 10/1999 | Matsui |
| 5,966,324 A | 10/1999 | Wada et al. |
| 6,091,628 A | 7/2000 | Kim |
| 6,150,687 A | 11/2000 | Noble et al. |

FOREIGN PATENT DOCUMENTS

| JP | 1-185966 | 7/1989 |
| JP | 7-130877 | 5/1995 |
| JP | 8-186181 | 7/1996 |
| JP | 9-45796 | 2/1997 |

OTHER PUBLICATIONS

"CAD–Compatible High–Speed CMOS/SIMOX Technology Using Field–Shield Isolation for IM Gate Array" T. Iwamatsu et al., IEDM 93, pp. 475–478.
Wada Y. et al: "A 128KB Sram With Soft Error Immunity For 0.35μm Soi–Cmos Embeddded Cell Arrays" 1998 IEEE International Soi Conference Proceedings. Stuart, Fl., Oct. 5–8, 1998, Annual IEEE International Silicon–On–Insulator Conference, New York, NY: IEEE, US, vol., Conf. 24, Oct. 5, 1998, pp. 127–128, XP000830678; ISBN: 0–7803–4501–0.

*Primary Examiner*—David Nelms
*Assistant Examiner*—Gene N. Auduong
(74) *Attorney, Agent, or Firm*—McDermott, Will & Emery

(57) ABSTRACT

A memory cell includes an n well and a p well. A word line is provided over memory cell and n well and p well are arranged in a direction in which word line extends. A single word line is provided for each memory cell and formed of metal.

3 Claims, 9 Drawing Sheets

STATIC SEMICONDUCTOR MEMORY DEVICE

This application is a divisional of application Ser. No 09/166,906 filed Oct. 6, 1998 now U.S. Pat. No. 6,359,804.

BACKGROUND OF THE INVENTION

1. Field of the Invention

The present invention relates to a static semiconductor memory device (hereinafter simply referred to as an SRAM).

2. Description of the Background Art

Generally, a memory cell for an SRAM is formed of six elements in total including four n type transistors (Q1, Q2: access transistors, Q3, Q4: driver transistors) and two p type transistors (Q5, Q6: load transistors), as shown in FIG. 11. Two storage nodes 19a and 19b which are cross coupled have a bistable state of (H, L) or (L, H) and do not change their states if a prescribed power supply voltage is applied.

For data writing, a flip-flop state is set by selecting a word line to open gates (transfer gates) of access transistors Q1 and Q2 and forcing a voltage to be applied to a pair of bit lines in accordance with a desired logic value. For data reading, the above mentioned transfer gates are opened and the potentials of storage nodes 19a and 19b are transmitted to the bit lines. It is noted that, in FIG. 11, a cell current 20 is shown which flows from the Low side of storage nodes 19a and 19b of the memory cell to a ground line (a GND line) through a bit line BL or a complementary bit line /BL from a bit line load (not shown in the drawing) during reading operation.

FIG. 12 shows a layout of a memory cell for an SRAM of the type disclosed in Japanese Patent Laying-Open No. 8-186181, for example. It is noted that a power supply line, ground line, bit line and the like are not shown for the convenience of the drawing.

Referring to FIG. 12, a memory cell 1 has n and p wells 2 and 3 provided adjacent to each other. Load transistors Q5 and Q6 are formed in n well 2. Access transistors Q1, Q2 and driver transistors Q3, Q4 are formed in p well 3.

A pair of word lines 17a and 17b are provided over memory cell 1, and a gate of driver transistor Q3 is connected to p and n type impurity regions through contacts 18a and 18b, respectively. In addition, a gate of driver transistor Q4 is connected to p and n type impurity regions through contacts 18c and 18d, respectively.

As shown in FIG. 12, n and p wells 2 and 3 are provided adjacent to each other in a direction in which word lines 17a and 17b extend, making memory cell 1 longer in the direction of the word lines. Thus, a pitch of a metal interconnection which functions as a bit line or the like increases. In addition, a capacitance between metal interconnections is reduced so that an SRAM capable of operating at a high speed is obtained.

However, memory cell 1 is longer in the direction of word lines 17a and 17b as described above, resulting in longer word lines 17a and 17b when such memory cells are arranged in a matrix. Consequently, there arises a problem associated with a signal delay caused by a word line (hereinafter referred to as a "word line delay").

SUMMARY OF THE INVENTION

The present invention is made to solve the aforementioned problem. It is an object of the present invention to provide an SRAM which has a memory cell including transistor formation regions of different conductivity types provided in a direction of a word line and which is capable of preventing the word line delay.

According to one aspect of the present invention, an SRAM includes a memory cell, a word line and first and second transistor regions. The memory cell includes a pair of access transistors, a pair of driver transistors and a pair of load transistors. The word line is provided for the pair of access transistors. The pair of load transistors are formed in the first transistor region. The second transistor region is provided adjacent to the first transistor region in the direction of the word line and has the pair of access transistors and the pair of driver transistors.

In order to reduce a resistance of the word line to prevent the word line delay, the word line can be formed of metal. In the conventional example shown in FIG. 12, however, as two word lines are formed for a single memory cell and p and n wells are arranged in a direction in which the word lines extend, two metal interconnections must be formed in a direction of the shorter sides of the memory cell so as to form the word line of metal. As a result, a pitch between the metal interconnections is made small, whereby the formation of the metal interconnection becomes difficult and a capacitance between the metal interconnections increases. On the other hand, in the present invention, as only one word line is provided, the word line can easily be formed of metal and the resistance of the word line can be reduced. Thus, the word line delay can be prevented.

Preferably, the above mentioned word line is formed of metal. Thereby, the resistance of the word line can be reduced and the word line delay is prevented as described above.

In addition, the SRAM includes first and second memory cells which are arranged in the direction of the word line such that the second transistor regions are adjacent to each other. A metal ground line, which is shared by the first and second memory cells, is provided over the word line in a direction which is orthogonal to the word line. Pairs of metal bit lines for the first and second memory cells are arranged on opposite sides of the metal ground line.

As the metal ground line which are shared by the first and second memory cells is provided in the direction orthogonal to the word line as described above, a cell current for the two memory cells flows to the single metal ground line. Thus, the increase in the potential of the ground line due to the cell current can effectively be prevented.

In addition, a field shield separation (isolation) region may be formed in the memory cell. In this case, preferably, the field shield separation region between the pair of driver transistors is continuously formed in the direction which is orthogonal to the word line to traverse the memory cell.

By forming the field shield separation region as described above, generation of an isolated region in the field shield separation region can effectively be prevented when a plurality of memory cells are arranged in a matrix. When such isolated region is formed, a contact for fixing a potential of the isolated region must be formed, thereby causing a problem that the metal interconnection cannot freely be patterned. In the present invention, however, the metal interconnection can more freely be patterned as compared with the case where the isolated region exists since the isolated region is not generated as described above.

In addition, a first impurity region is shared by one access transistor and one driver transistor and a second impurity region is shared by the other access transistor and the other driver transistor. Preferably, the interval between the ones of the access and driver transistors differs from that between the others of the access and driver transistors.

As shown in FIG. 1, for example, a channel width of the driver transistor is generally set greater than that of the access transistor. In this case, if the intervals between the access and driver transistors are different as described above, the driver transistors can be formed offset in the direction which is orthogonal to the word line. Thereby, the memory cell can be reduced in length in the direction of the word line as compared with the case where the driver transistors are arranged spaced by an equal distance from the word line. This is also contributable to the prevention of the word line delay.

According to another aspect, an SRAM of the present invention includes a memory cell, a word line and first and second transistor regions. The memory cell includes a pair of access transistors, a pair of driver transistors and a pair of load transistors, each having a gate. The word line is provided over the memory cell. The pair of load transistors are formed in the first transistor region. The second transistor region is provided adjacent to the first transistor region in the direction in which the word line extends and has the pair of access transistors and the pair of driver transistors. The gate of the load transistor is orthogonal to that of the driver transistor.

As the gate of the load transistor is orthogonal to that of the driver transistor as described above, one of the gates can be provided in the direction which is orthogonal to the word line. Thereby, the memory cell is reduced in length in the direction of the word line and expanded in the direction which is orthogonal to the word line. As a result, the word line can be reduced in length and the word line delay can be prevented. In addition, even when two word lines are provided as in the conventional example, the word lines can be formed of metal as the memory cell is increased in length in the direction which is orthogonal to the word line. In this case, the word line delay can more effectively be prevented.

The above mentioned memory cell is formed on a semiconductor layer provided on a substrate with an insulation film interposed. In other words, according to the present aspect, an SRAM has an SOI (Semiconductor On Insulator) structure. The above mentioned load transistor and driver transistor have pairs of first and second impurity regions of first and second conductivity types, respectively. In this case, preferably, ones of the first and second impurity regions are in contact with each other and the others of the first and second impurity regions are arranged orthogonal to each other.

As the first and second impurity regions are arranged orthogonal to each other as described above, the gates of the load and driver transistors are also arranged orthogonal to each other, whereby the aforementioned effect is obtained. In addition, when the SOI structure is employed as in the present aspect, the first and second impurity regions of different conductivity types can be abut against each other. Thus, the memory cell can be further reduced in length in the direction of the word line. This is also contributable to the prevention of the word line delay.

In addition, the pair of access transistors and the pair of driver transistors may be arranged in a single line in the direction which is orthogonal to the word line.

Thereby, the memory cell can be further reduced in length in the direction of the word line as compared with the case described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to FIGS. 1 to 10.

First Embodiment

Figure 1:
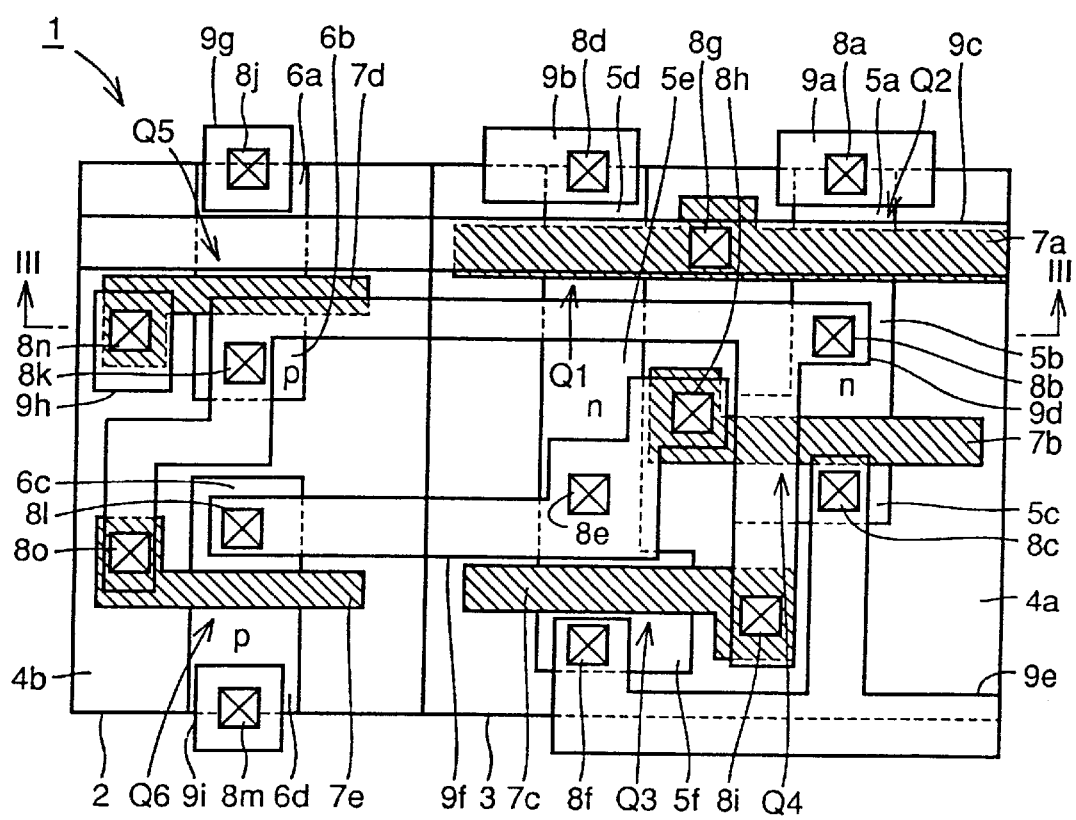
FIG. 1 is a plan view showing a memory cell in a manufacturing process up to a first metal interconnection for an SRAM in accordance with a first embodiment of the present invention.
Figure 2:
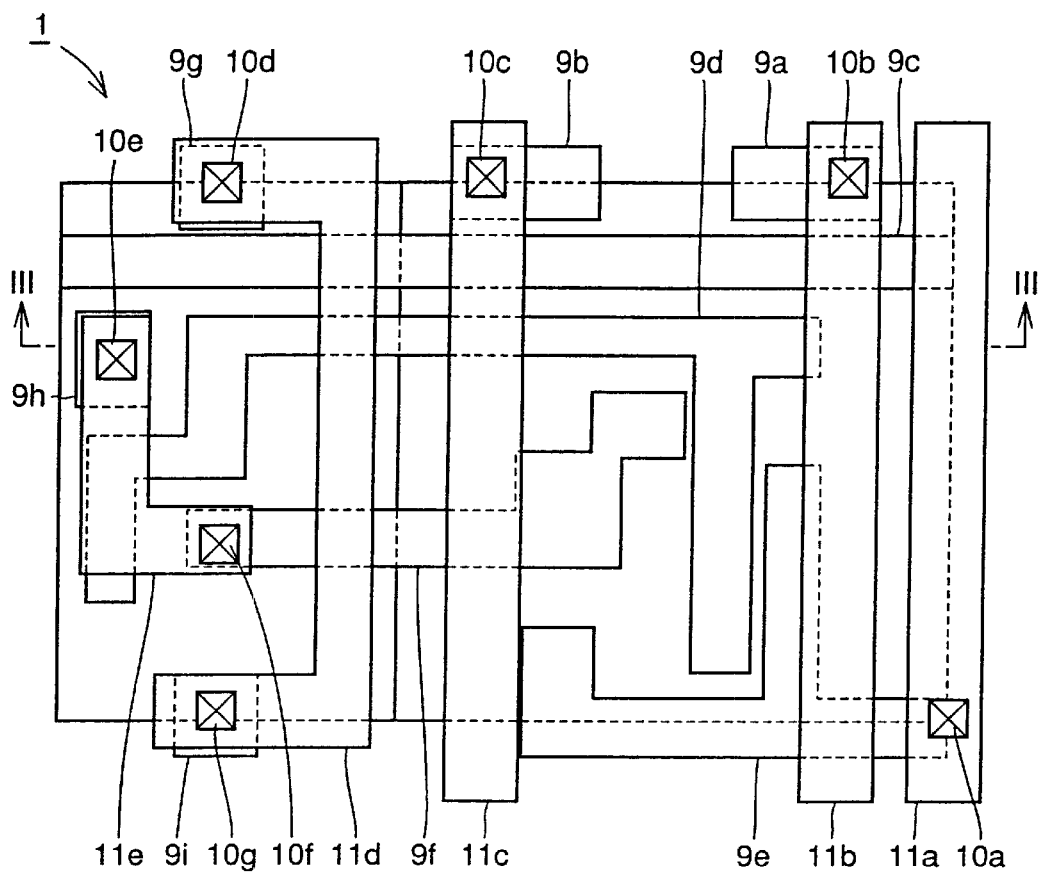
FIG. 2 is a plan view showing the memory cell for the SRAM in accordance with the first embodiment of the present invention.
Figure 3:
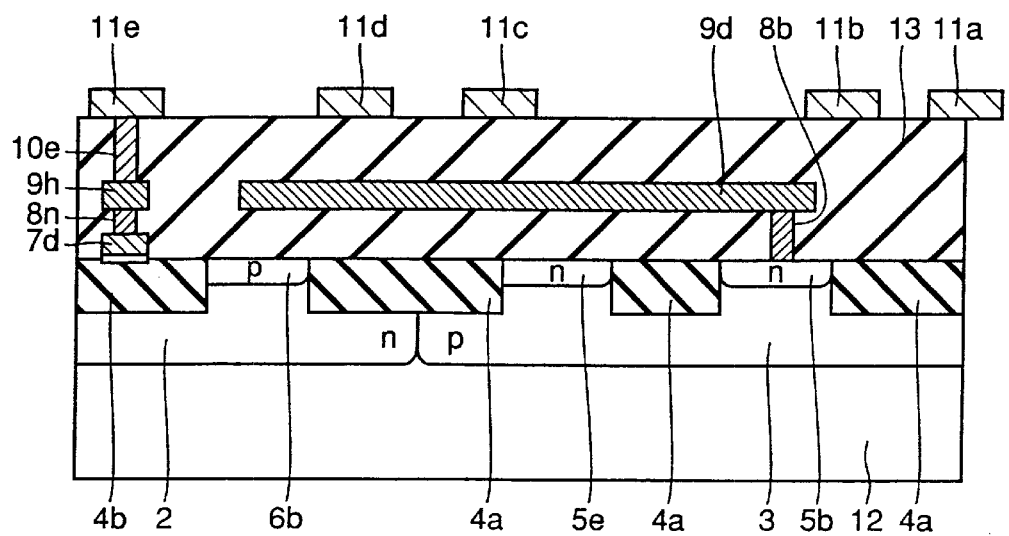
FIG. 3 is a cross sectional view taken along the line III—III in FIGS. 1 and 2.

Referring first to FIGS. 1 to 7, a first embodiment of the present invention and a modification thereof will be described. FIG. 1 is a plan view showing a memory cell 1 for an SRAM in accordance with the first embodiment of the present invention. It is noted that a memory cell up to a first metal interconnection is shown in FIG. 1 for the convenience of the explanation. A second metal interconnection is shown in FIG. 2. FIG. 3 is a cross sectional view taken along the line III—III in FIGS. 1 and 2.

Referring first to FIGS. 1 and 3, memory cell 1 includes an n well (a first transistor region) 2 and a p well (a second transistor region) 3. Load transistors Q5 and Q6 are formed on n well 2. Load transistor Q5 includes a polysilicon gate 7d and p type impurity regions 6a and 6b. Load transistor Q6 includes a polysilicon gate 7e and p type impurity regions 6c and 6d.

Access transistors Q1, Q2 and driver transistors Q3, Q4 are formed on p well 3. Access transistor Q1 includes n type impurity regions 5d and 5e and a polysilicon gate 7a. Access transistor Q2 shares polysilicon gate 7a with access transistor Q1 and includes n type impurity regions 5a and 5b.

Driver transistor Q3 includes a polysilicon gate 7c and n type impurity regions 5f and 5e. Driver transistor Q4 includes a polysilicon gate 7b and n type impurity regions 5b and 5c.

A trench separation (isolation) region 4a is formed in the periphery of n type impurity regions 5a to 5f and a trench separation region 4b is formed in the periphery of p type impurity regions 6a to 6d. Trench separation regions 4a and 4b are formed by burying insulation films in trenches formed in a main surface of semiconductor substrate 12 as shown in FIG. 3.

Above the aforementioned polysilicon gates 7a to 7e, first metal interconnections 9a to 9j including aluminum, tungsten, copper or the like are formed with an interlayer insulation film 13 interposed as shown in FIG. 3. First metal interconnections 9a and 9b are connected to n type impurity regions 5a and 5d through contact holes 8a and 8d, respectively. First metal interconnection 9c functions as a word line and is connected to polysilicon gate 7a through a contact hole 8g. First metal interconnection 9d is connected to n type impurity region 5b, polysilicon gate 7c, p type impurity region 6b and polysilicon gate 7e through contact holes 8b, 8i, 8k and 8o, respectively.

First metal interconnection 9e is connected to n type impurity regions 5c and 5f through contact holes 8c and 8f, respectively. First metal interconnection 9f is connected to polysilicon gate 7b, n type impurity region 5e and p type impurity region 6c through contact holes 8h, 8e and 8l, respectively. First metal interconnections 9g, 9h and 9i are connected to p type impurity region 6a, polysilicon gate 7d and p type impurity region 6d through contact holes 8j, 8n and 8m, respectively.

Referring now to FIGS. 2 and 3, second metal interconnections 11a to 11e including aluminum, tungsten, copper or the like are formed on first metal interconnections 9a to 9i with interlayer insulation film 13 interposed. Second metal interconnection 11a functions as a ground line and is connected to first metal interconnection 9e via a through hole 10a. Second metal interconnections 11c and 11b function as a bit line (BL) and a /bit line (/BL). Second metal interconnections 11c and 11b are connected to first metal interconnections 9b and 9a via through holes 10c and 10b, respectively.

Second metal interconnection 11d functions as a power supply line (a Vcc line) and is connected to first metal interconnections 9g and 9i via through holes 10d and 10g, respectively. Second metal interconnection 11e is connected to first metal interconnections 9h and 9f via through holes 10e and 10f, respectively. A plug is formed in each of through holes 10a to 10g.

As only one word line (9c) is provided and the word line is formed of metal as described above, a resistance of the word line can be reduced as compared with the conventional example. Thereby, the word line delay is prevented.

In addition, as shown in FIG. 1, an interval between access transistor Q1 and driver transistor Q3 is set larger than that between access transistor Q2 and driver transistor Q4. Therefore, driver transistors Q3 and Q4 are arranged offset with respect to each other in the direction which is orthogonal to word line (9c). Thus, even when channel widths of driver transistor Q3 and Q4 are greater than those of access transistors Q1 and Q2, the length of memory cell 1 in the direction of the word line can be kept small. This is also contributable to the prevention of the word line delay.

Figure 4:
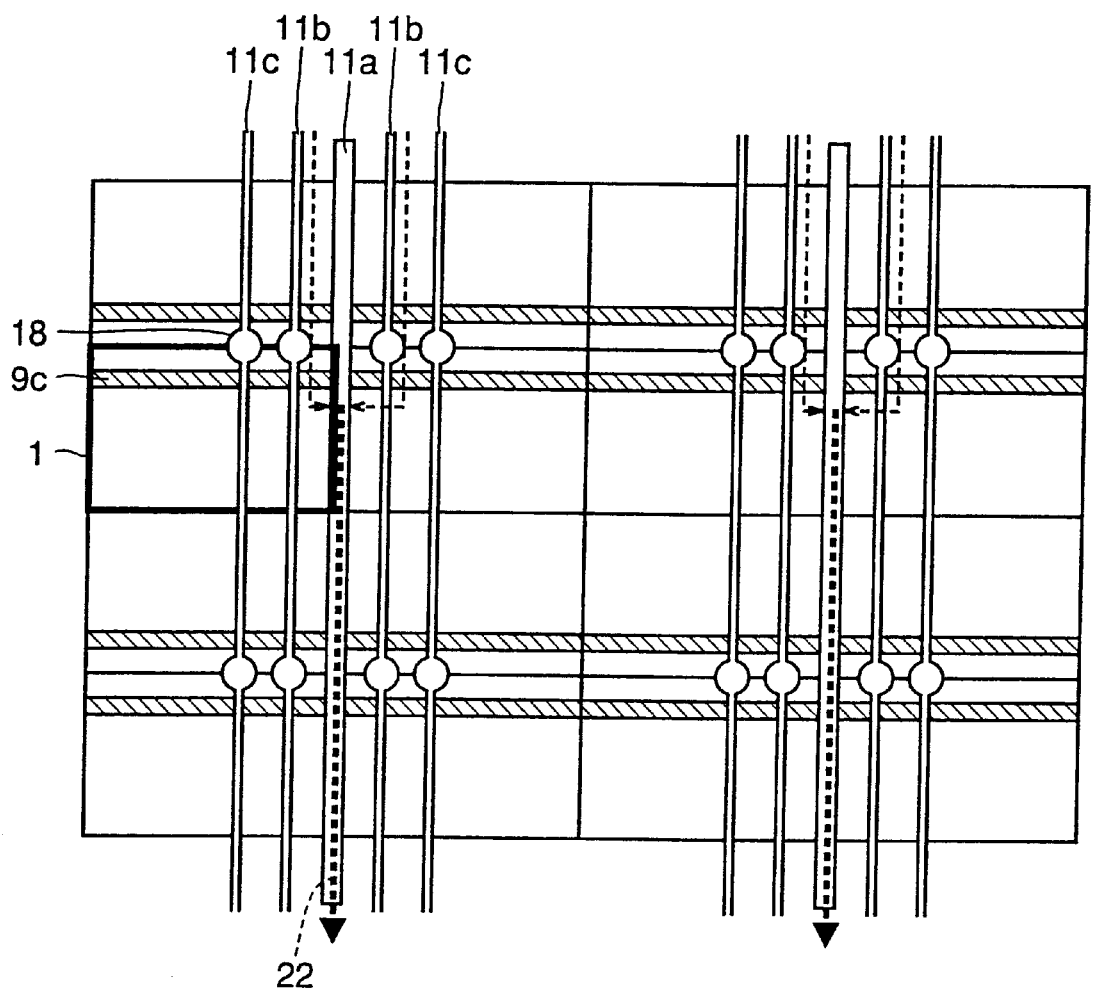
FIG. 4 is a plan view showing the memory cells in FIG. 1 arranged in a matrix.

Referring now to FIG. 4, an exemplary arrangement of memory cell 1 shown in FIG. 1 will be described. As shown in FIG. 4, memory cells 1 are arranged in a matrix and a ground line (11a) is shared by two memory cells 1 which are provided adjacent to each other in the direction of the word line (9c). In this case, a set of memory cells 1 which shares the ground line (11a) are arranged in the direction of the word line (9c) such that p wells 3 are adjacent to each other. A BL (11c) and a /BL (11b) are provided for each memory cell 1 on opposite sides of ground line (11a).

As shown in FIG. 4, the ground line (11a), the BL (11c) and the /BL (11b) are provided in the direction which is orthogonal to the word line (9c), so that cell current 20 for two memory cells 1 flows through the single ground line (11a). Thereby, the increase in a potential of the ground line due to cell current 20 can be prevented. It is noted that a bit line contact is denoted by a reference numeral 18 in FIG. 4.

Figure 5:
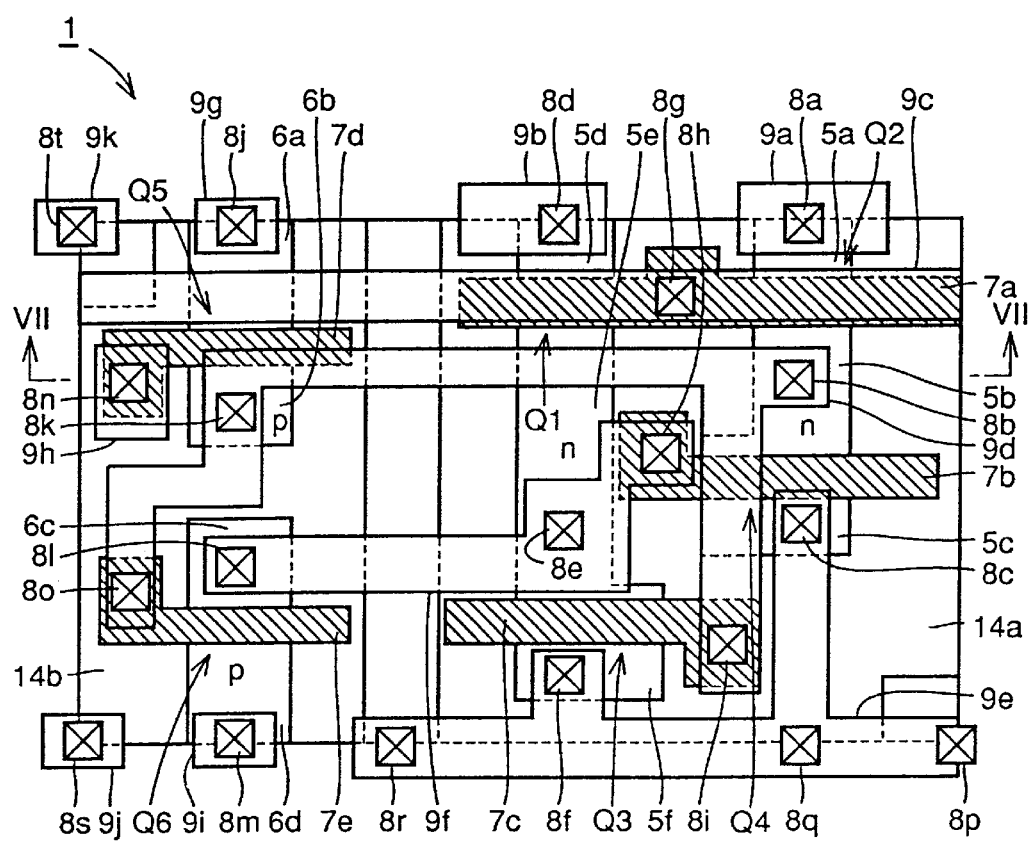
FIG. 5 is a plan view showing a memory cell in a manufacturing process up to a first metal interconnection in accordance with a modification of the first embodiment.
Figure 6:
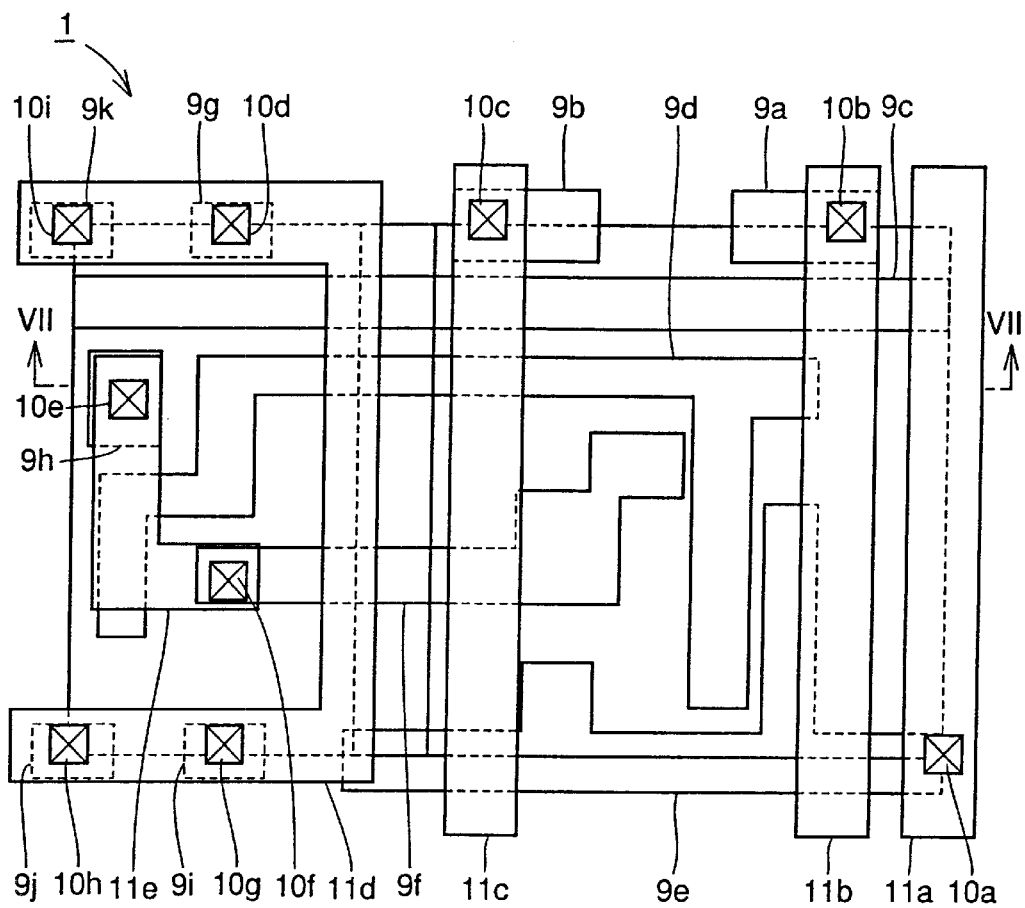
FIG. 6 is a plan view showing the memory cell in accordance with the modification of the first embodiment.
Figure 7:
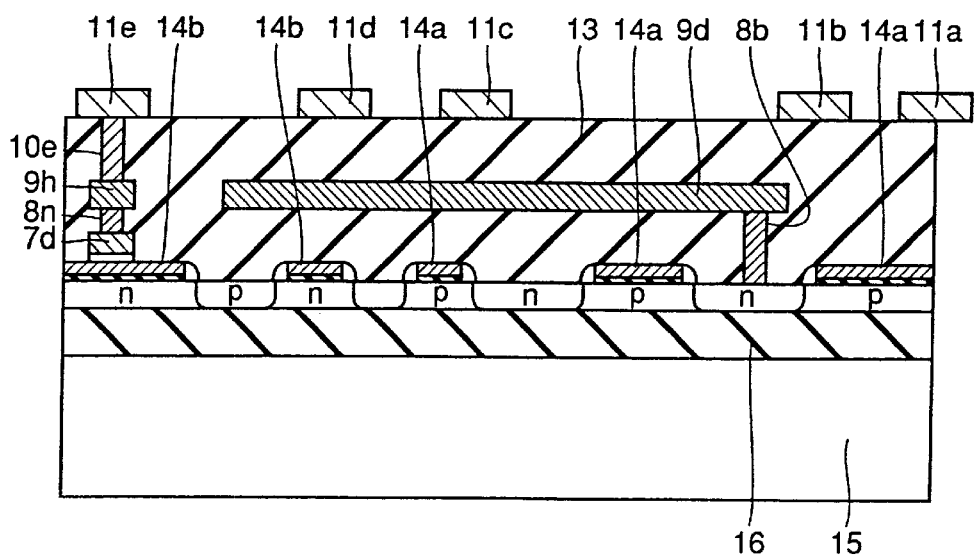
FIG. 7 is a cross sectional view taken along the line VII—VII in FIGS. 5 and 6.

Referring to FIGS. 5 to 7, a modification of the above mentioned first embodiment will be described. FIGS. 5 and 6 are plan views showing memory cell 1 for an SRAM according to a modification of the first embodiment, and FIG. 7 is a cross sectional view taken along the line VII—VII in FIGS. 5 and 6.

Referring first to FIG. 7, in the present modification, the SRAM has an SOI (Semiconductor On Insulator) structure and a field shield separation (isolation) is employed. More specifically, an SOI layer (a semiconductor layer) is formed on a substrate 15 with an insulation film 16 interposed and transistors are formed in the SOI layer. In addition, field shield separation regions 14a and 14b are provided having field shield gates which are formed on the semiconductor layer with the insulation film interposed. Ground and power supply potentials are applied to field shield separation regions 14a and 14b for separation on the sides of n and p type transistors, respectively. Thus, field shield separation regions 14a and 14b are separated as shown in FIG. 5.

In addition, contact holes 8p, 8r and 8t are provided for supplying potentials for the SOI layer in the field shield separation regions. Contact holes 8q and 8s are provided for fixing the potentials of the field shield gates. In addition, a first metal interconnection 9e is provided over contact holes 8q and 8r and connected to the SOI layer and the field shield gates therethrough. First metal interconnections 9k and 9j are formed on contact holes 8t and 8s.

Referring now to FIG. 6, in the present modification, second metal interconnection 11d extends even over first metal interconnections 9j and 9k. Second metal interconnection 1d is connected to first metal interconnections 9k and 9j via through holes 10i and 10h, respectively. Other parts of the structure are almost the same as those for the case shown in FIG. 2.

An effect similar to that of the above described first embodiment can be obtained also in the case of the present modification. As shown in FIG. 5, field shield separation region 14a between driver transistors Q3 and Q4 is continuously formed to traverse memory cell 1 in the direction which is orthogonal to the word line (9c). Therefore, also in the case where a plurality of memory cells 1 are arranged in a matrix, generation of an isolated region within the field shield separation region can effectively be prevented. When the isolated region is generated in the field shield separation region, a contact hole for fixing a potential of the isolated region must be formed, whereby a metal interconnection or the like cannot freely be formed. However, in the present modification, the isolated region is not formed as described above, so that the metal interconnection or the like can freely be formed.

Second Embodiment

Figure 8:
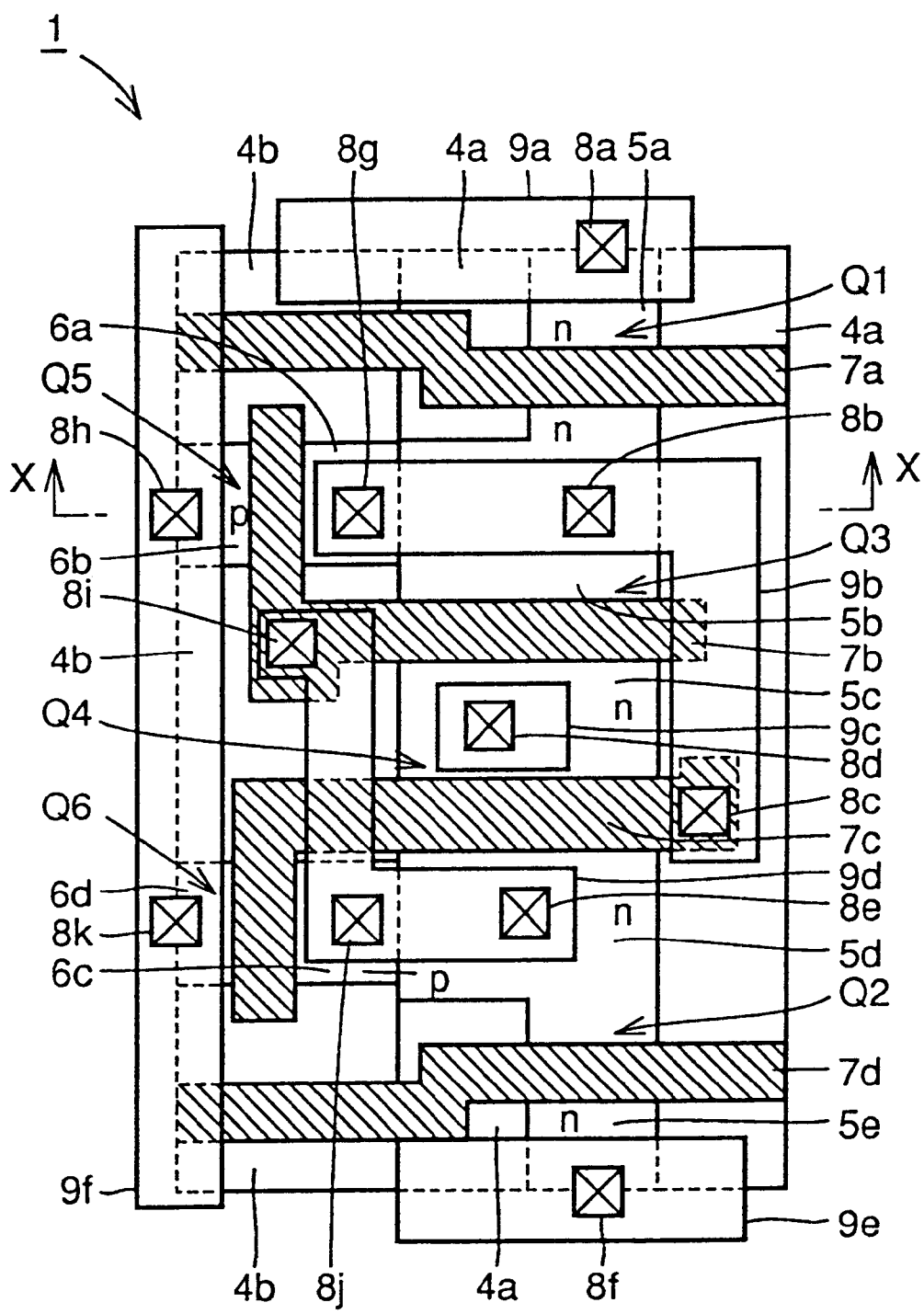
FIG. 8 is a plan view showing a memory cell in a manufacturing process up to a first metal interconnection for an SRAM in accordance with a second embodiment of the present invention.
Figure 9:
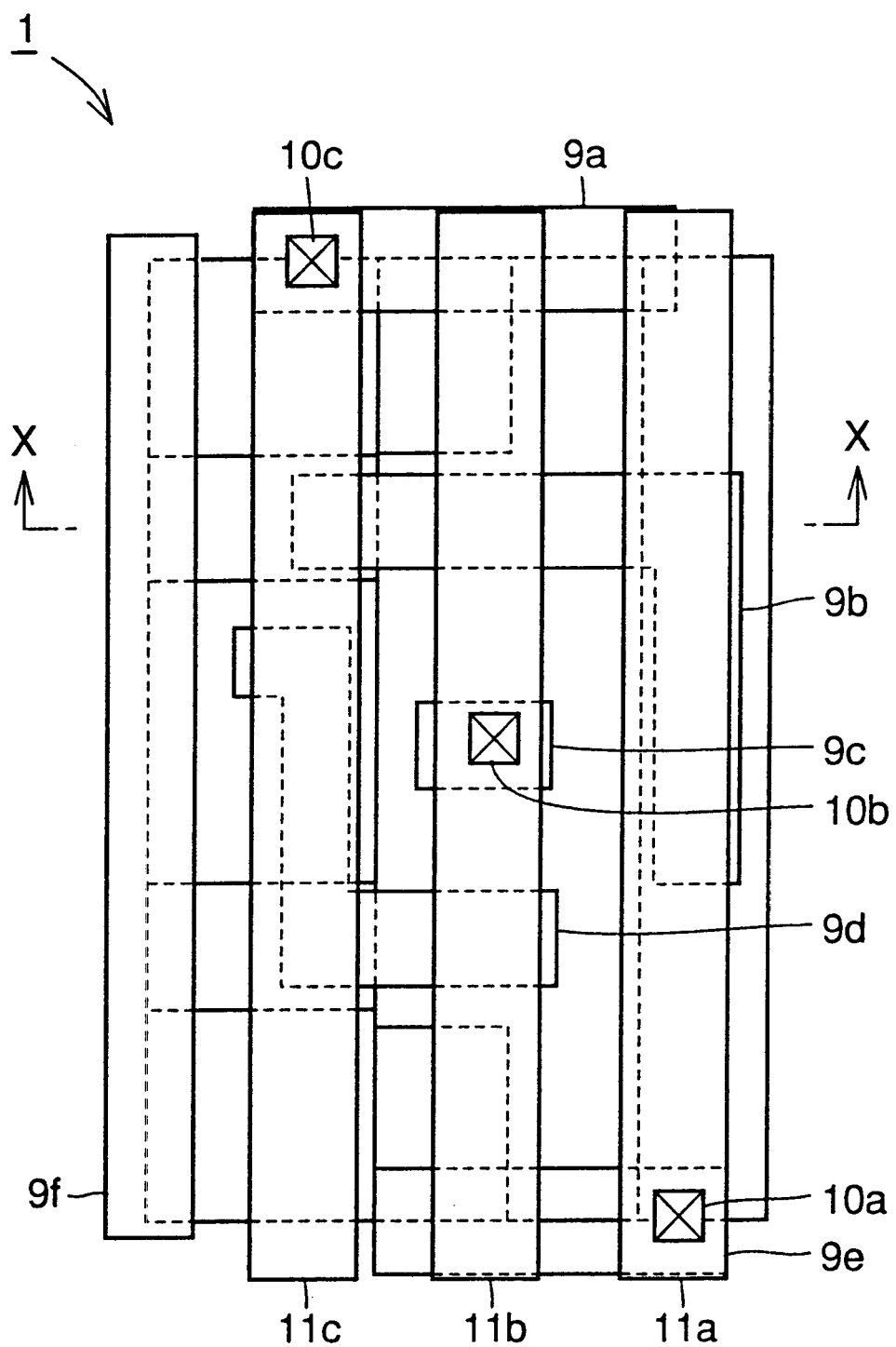
FIG. 9 is a plan view showing the memory cell for the SRAM in accordance with the second embodiment of the present invention.
Figure 10:
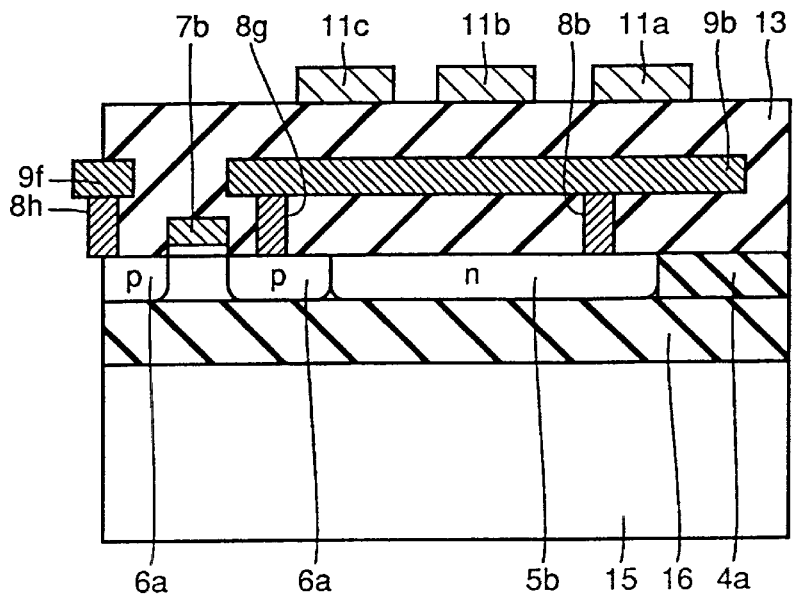
FIG. 10 is a cross sectional view taken along the line X—X in FIGS. 8 and 9.
Figure 11:
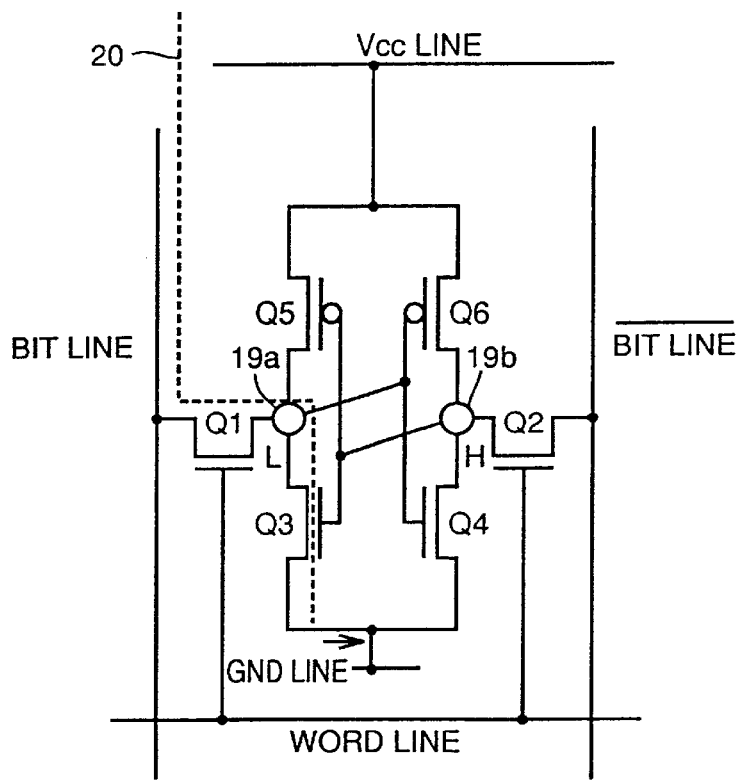
FIG. 11 is a diagram showing an equivalent circuit for the SRAM.
Figure 12:
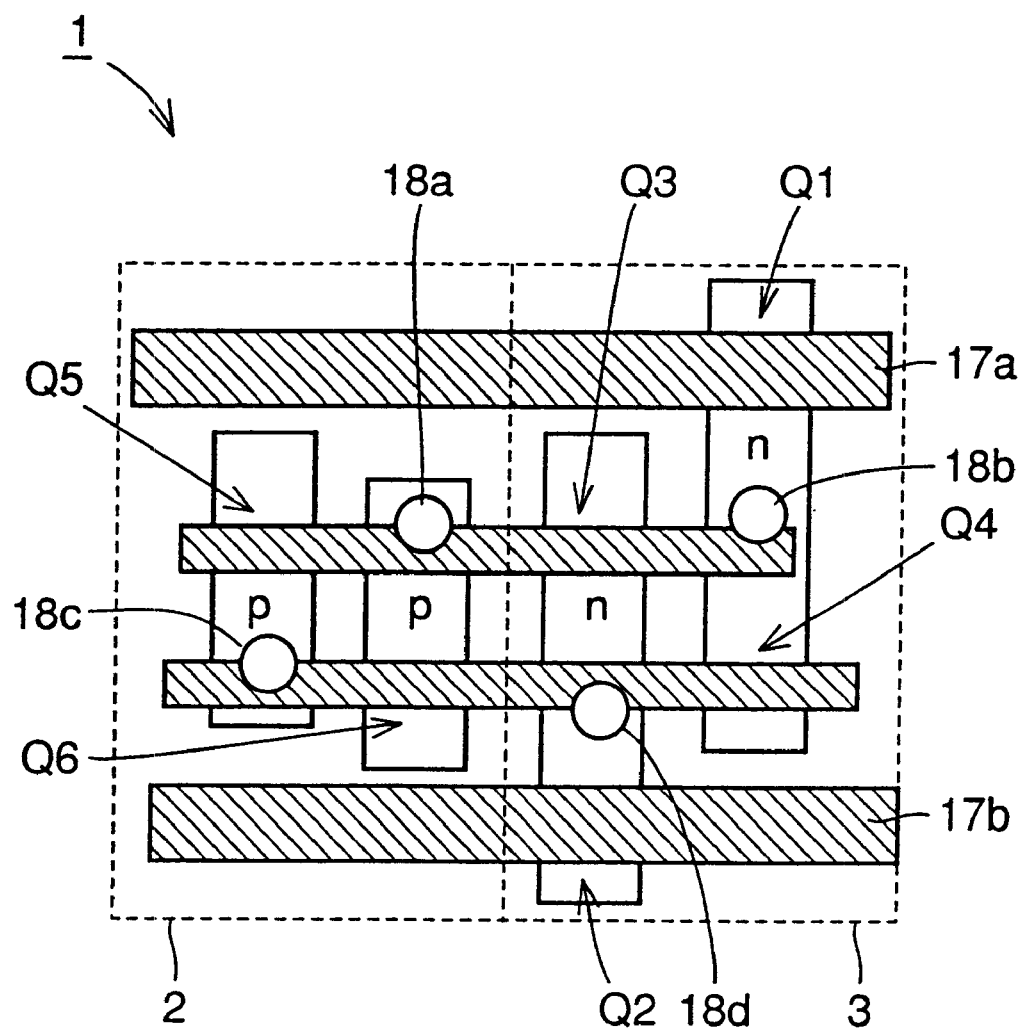
FIG. 12 is a plan view showing an example of a memory cell structure for a conventional SRAM.

Referring now to FIGS. 8 to 10, a second embodiment of the present invention will be described. FIGS. 8 and 9 are plan views of a memory cell for an SRAM in accordance with the second embodiment of the present invention. FIG. 10 is a cross sectional view taken along the line X—X in FIGS. 8 and 9.

In the second embodiment, SOI and trench separation structures are employed as shown in FIG. 10. Gates of load transistors Q5 and Q6 are provided orthogonal to those of driver Q3 and Q4. Thereby, the gates of load transistors Q5 and Q6 can be provided in the direction which is orthogonal to word lines (7a and 7d), whereby a memory cell 1 can be reduced in length in the direction of the word line. Thus, the word line is shortened and the word line delay can be prevented.

As shown in FIG. 8, access transistors Q1, Q2 and driver transistors Q3, Q4 are arranged in a single line in the direction which is orthogonal to the word lines (7a, 7d). This is also contributable to the reduction in length of memory cell 1 in the direction of the word lines (7a, 7d). In addition, p type impurity regions 6a and 6c are abut against n type impurity regions 5b and 5d, respectively. Thereby, memory cell 1 can be reduced in length in the direction of the word lines (7a, 7d) as compared with the case where the wells of different conductivity types are formed as shown in FIG. 1. This is also contributes to the reduction in length of the word lines (7a, 7d).

In addition, further reduction in the size of the memory cell can be achieved as compared with the case shown in FIG. 1. Memory cell 1 shown in FIG. 1 requires a well separation width of 0.6 $\mu$m in accordance with the 0.18 $\mu$m rule. Here, as the length of memory cell 1 in the direction which is orthogonal to the word line (9c) is about 1.5 $\mu$m, an extra area due to the well separation would be 0.6×1.5=0.9 $\mu m^2$. On the other hand, in the present second embodiment, the well separation width is not necessary and the corresponding reduction in the area of memory cell 1 can be achieved.

Further, as shown in FIG. 8, in the present second embodiment, the length of memory cell 1 in the direction which is orthogonal to the word lines (7a, 7d) is longer than that in the direction in which the word lines (7a, 7d) extend. Therefore, even when two word lines (7a, 7d) are provided for a single memory cell 1, these word lines can be formed of metal as in the case of the first embodiment. In this case, further prevention of the word line delay can be achieved.

As shown in FIG. 8, p type impurity regions 6a and 6b are arranged in the direction which is orthogonal to n type impurity regions 5b and 5c, and p type impurity regions 6c and 6d are arranged in the direction which is orthogonal to n type impurity regions 5c and 5d. Thereby, gates of load transistors Q5 and Q6 can be arranged orthogonal to those of driver transistors Q3 and Q4 as described above.

Referring now to FIG. 9, in the present second embodiment, second metal interconnections 11a to 11c are formed and the number of second metal interconnections is decreased as compared with the case of the first embodiment. Thus, even when the length of memory cell 1 is reduced in the direction of the word lines (7a, 7d), second metal interconnections 11a to 11c can relatively easily be formed. It is noted that a first metal interconnection 9f functions as a power supply line. Further, the principle of the present second embodiment is applicable to a memory cell for an SRAM with the wells formed as shown in FIG. 1.

As in the foregoing, according to the SRAM of the present invention, the word line delay is effectively be prevented. Therefore, the high performance SRAM is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:

a memory cell;

a pair of access transistors in said memory cell;

a pair of word lines connected to gate electrodes of respective said access transistors;

a pair of load transistors positioned between said pair of word lines in said memory cell, said load transistors having respective gate electrodes arranged orthogonally to said word lines;

a pair of driver transistors positioned between said pair of word lines in said memory cell, said driver transistors having respective gate electrodes arranged orthogonally to the gate electrodes of said load transistors, said driver transistors further sharing a source active region and arranged in an extending direction of said pair of word lines with respect to said pair of load transistors.

2. The static semiconductor memory device according to claim 1, wherein:

said memory cell is formed on a semiconductor layer provided on a substrate with an insulation film interposed, said load transistors have a pair of first impurity regions of a first conductivity type, said driver transistors have a pair of second impurity regions of a second conductivity type, and ones of each first impurity region is in contact with a respective second impurity region.

3. The static semiconductor memory device according to claim 1, wherein said pair of access transistors and said pair of driver transistors are arranged in series in a direction orthogonal to the extending direction of said pair of word lines.

* * * * *